United States Patent
Jun et al.

(10) Patent No.: US 8,644,101 B2
(45) Date of Patent: Feb. 4, 2014

(54) LOCAL SENSE AMPLIFIER CIRCUIT AND SEMICONDUCTOR MEMORY DEVICE INCLUDING THE SAME

(75) Inventors: In-Woo Jun, Hwaseong-si (KR); Won-Chang Jung, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 81 days.

(21) Appl. No.: 13/360,932

(22) Filed: Jan. 30, 2012

(65) Prior Publication Data

US 2012/0195146 A1 Aug. 2, 2012

(30) Foreign Application Priority Data

Feb. 1, 2011 (KR) .................. 10-2011-0009989

(51) Int. Cl.
*G11C 7/00* (2006.01)

(52) U.S. Cl.
USPC ....................................... 365/203

(58) Field of Classification Search
USPC ....................................... 365/203
See application file for complete search history.

(56) References Cited

U.S. PATENT DOCUMENTS

| | | | |
|---|---|---|---|
| 6,208,575 B1 * | 3/2001 | Proebsting | 365/208 |
| 7,430,147 B2 | 9/2008 | Kwack | |
| 7,477,558 B2 * | 1/2009 | Lee et al. | 365/203 |
| RE42,976 E * | 11/2011 | Ahn et al. | 365/222 |
| 8,072,790 B2 * | 12/2011 | Kim | 365/145 |
| 8,116,149 B2 * | 2/2012 | Chen et al. | 365/189.15 |
| 8,300,485 B2 * | 10/2012 | Lim et al. | 365/207 |
| 8,406,073 B1 * | 3/2013 | Somasekhar et al. | 365/203 |
| 2008/0037333 A1 * | 2/2008 | Kim et al. | 365/189.02 |
| 2010/0110772 A1 | 5/2010 | Lee | |

FOREIGN PATENT DOCUMENTS

| | | |
|---|---|---|
| KR | 10-0656452 B1 | 12/2006 |
| KR | 10-0763253 B1 | 9/2007 |
| KR | 10-2010-0049192 A | 5/2010 |

* cited by examiner

*Primary Examiner* — Hoai V Ho
*Assistant Examiner* — Pablo Huerta
(74) *Attorney, Agent, or Firm* — Lee & Morse, P.C.

(57) ABSTRACT

A local sense amplifier circuit in a semiconductor memory device, the local sense amplifier circuit including a local data sensing unit configured to amplify a voltage difference between a local input/output (I/O) line pair based on a local sensing enable signal to provide the amplified voltage difference to a global I/O line pair, the local I/O line pair including a first local I/O line and a second local I/O line, and a local I/O line control unit including a first capacitor and a second capacitor, the first capacitor increasing a voltage level of the first local I/O line based on the local sensing enable signal, the second capacitor increasing a voltage level of the second local I/O line based on the local sensing enable signal.

16 Claims, 9 Drawing Sheets

100a

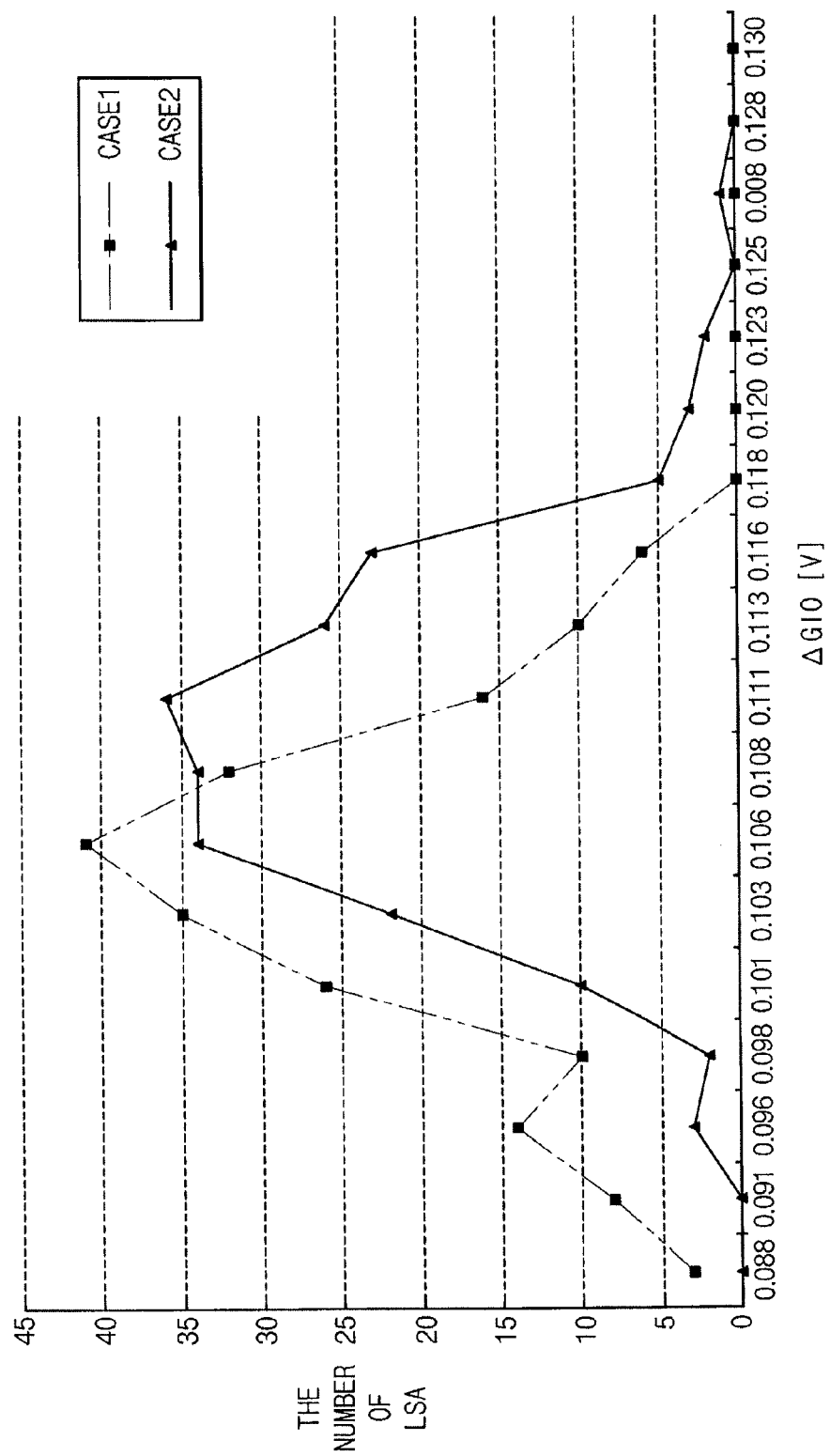

LOCAL SENSE AMPLIFIER CIRCUIT AND SEMICONDUCTOR MEMORY DEVICE INCLUDING THE SAME

CROSS-REFERENCE TO RELATED APPLICATION

Korean Patent Application No. 10-2011-0009989, filed on Feb. 1, 2011, in the Korean Intellectual Property Office, and entitled: "Local Sense Amplifier Circuit and Semiconductor Memory Device Including the Same," is incorporated by reference herein in its entirety.

BACKGROUND

1. Technical Field

Example embodiments relate to a charge sensing technique, and more particularly to a sense amplifier circuit and a semiconductor memory device including the sense amplifier circuit.

2. Description of the Related Art

A sense amplifier circuit may be used during a data I/O procedure in a semiconductor memory device. The semiconductor memory device may include, e.g., the bit-line sense amplifier and a local sense amplifier. The bit-line sense amplifier may sense and amplify data read from a plurality of memory cells, and may transmit the amplified data to a pair of input and output (I/O) lines. The local sense amplifier may sense and amplify the data transmitted from the pair of local I/O lines, and then transmit the amplified data via a pair of global I/O lines.

SUMMARY

An embodiment is directed to a local sense amplifier circuit in a semiconductor memory device, including a local data sensing unit and a local input/output (I/O) line control unit. The local data sensing unit may amplify a voltage difference between a local I/O line pair based on a local sensing enable signal to provide the amplified voltage difference to a global I/O line pair. The local I/O line pair may include a first local I/O line and a second local I/O line. The local I/O line control unit may include a first capacitor and a second capacitor. The first capacitor may increase a voltage level of the first local I/O line based on the local sensing enable signal. The second capacitor may increase a voltage level of the second local I/O line based on the local sensing enable signal.

The first capacitor may be a first metal oxide semiconductor (MOS) transistor that includes a gate electrode connected to the first local I/O line, a first electrode receiving the local sensing enable signal and a second electrode connected to the first electrode of the first MOS transistor. The second capacitor may be a second MOS transistor that includes a gate electrode connected to the second local I/O line, a first electrode receiving the local sensing enable signal and a second electrode connected to the first electrode of the second MOS transistor.

The first capacitor may be a first MOS transistor that includes a gate electrode receiving the local sensing enable signal, a first electrode connected to the first local I/O line and a second electrode connected to the first electrode of the first MOS transistor. The second capacitor may be a second MOS transistor that includes a gate electrode receiving the local sensing enable signal, a first electrode connected to the second local I/O line and a second electrode connected to the first electrode of the second MOS transistor.

The local I/O line control unit may increase the voltage levels of the local I/O line pair when the local sensing enable signal is activated. The local data sensing unit may amplify the voltage difference between the local I/O line pair to provide the amplified voltage difference to the global I/O line pair when the local sensing enable signal is activated.

The local data sensing unit may include a sensing block, an output block and a sensing control block. The sensing block may be connected to the local I/O line pair, and may sense the voltage difference between the local I/O line pair. The output block may amplify the sensed voltage difference in response to the local sensing enable signal to provide the amplified voltage difference to the global I/O line pair. The sensing control block may control the sensing operation of the sensing block and the amplifying operation of the output block in response to a selection enable signal.

The sensing control block may include a first MOS transistor. The first MOS transistor may have a first electrode receiving a ground voltage, a gate electrode receiving the selection enable signal, and a second electrode connected to a control node.

The sensing block may include a second MOS transistor and a third MOS transistor. The second MOS transistor may have a first electrode connected to the control node, a gate electrode connected to the first local I/O line, and a second electrode. The third MOS transistor may have a first electrode connected to the control node, a gate electrode connected to the second local I/O line, and a second electrode.

The output block may include a fourth MOS transistor and a fifth MOS transistor. The fourth MOS transistor may have a first electrode connected to the second electrode of the second MOS transistor, a gate electrode receiving the local sensing enable signal, and a second electrode connected to one of the global I/O line pair. The fifth MOS transistor may have a first electrode connected to the second electrode of the third MOS transistor, a gate electrode receiving the local sensing enable signal, and a second electrode connected to another one of the global I/O line pair.

Another embodiment is directed to a semiconductor memory device, including a memory cell array, a bitline sense amplifier circuit, a column selection circuit, a local sense amplifier circuit and an input/output (I/O) sense amplifier circuit. The memory cell array may be connected to a bitline pair. The bitline sense amplifier circuit may amplify a voltage difference between the bitline pair based on a bitline sensing enable signal. The column selection circuit may provide the amplified voltage difference between the bitline pair to a local I/O line pair in response to a column selection signal. The local I/O line pair may include a first local I/O line and a second local I/O line. The local sense amplifier circuit may amplify a voltage difference between the local I/O line pair based on a local sensing enable signal to provide the amplified voltage difference between the local I/O line pair to a global I/O line pair. The local sense amplifier circuit may include a first capacitor and a second capacitor. The first capacitor may increase a voltage level of the first local I/O line based on the local sensing enable signal. The second capacitor may increase a voltage level of the second local I/O line based on the local sensing enable signal. The I/O sense amplifier circuit may amplify a voltage difference between the global I/O line pair to generate a sensing output signal.

The local sense amplifier circuit may increase the voltage levels of the local I/O line pair when the semiconductor memory device reads out the data stored in the memory cell array.

The semiconductor memory device may further include a local I/O line precharge control circuit. The local I/O line precharge control circuit may precharge the local I/O line pair based on a precharge control signal and a precharge voltage.

The local I/O line precharge control circuit may include a first metal oxide semiconductor (MOS) transistor, a second MOS transistor, and a third MOS transistor. The first MOS transistor may have a first electrode connected to the first local I/O line, a gate electrode receiving the precharge control signal, and a second electrode connected to the second local I/O line. The second MOS transistor may have a first electrode connected to the first local I/O line, a gate electrode receiving the precharge control signal, and a second electrode receiving the precharge voltage. The third MOS transistor may have a first electrode connected to the second electrode of the second MOS transistor, a gate electrode receiving the precharge control signal, and a second electrode connected to the second local I/O line.

The semiconductor memory device may further include an I/O buffer. The I/O buffer may generate output data based on the sensing output signal.

The I/O sense amplifier circuit may amplify the voltage difference between the global I/O line pair with current mode or voltage mode.

Another embodiment is directed to an electronic device, including a processor, a memory cell array coupled to the processor, the memory cell array including at least one memory cell connected to a bitline pair, a bitline sense amplifier circuit configured to receive voltages of the bitline pair and provide amplified voltages to a local input/output (I/O) line pair, the local I/O line pair including a first local I/O line and a second local I/O line, a local sense amplifier circuit including a first capacitor and a second capacitor, the local sense amplifier circuit being configured to amplify a voltage difference between the local I/O line pair based on a local sensing enable signal to provide the amplified voltage difference between the local I/O line pair to a global I/O line pair, the first capacitor increasing a voltage level of the first local I/O line based on the local sensing enable signal, the second capacitor increasing a voltage level of the second local I/O line based on the local sensing enable signal, and an I/O sense amplifier circuit configured to amplify a voltage difference between the global I/O line pair to generate a sensing output signal.

The first capacitor may be a first metal oxide semiconductor (MOS) transistor that includes a gate electrode connected to the first local I/O line, and includes a first electrode and a second electrode coupled together and receiving the local sensing enable signal, and the second capacitor may be a second MOS transistor that includes a gate electrode connected to the second local I/O line, the second I/O line having a complementary signal to that of the first I/O line, the second capacitor further including a first electrode and a second electrode coupled together, coupled to the first and second electrodes of the first MOS transistor, and receiving the local sensing enable signal.

The first and second MOS transistors may be NMOS transistors, and the local sensing enable signal may provide a positive voltage pulse, relative to an inactive state of the local sensing enable signal, to the first and second electrodes of the first and second NMOS transistors.

BRIEF DESCRIPTION OF THE DRAWINGS

Illustrative, non-limiting example embodiments will be more clearly understood from the following detailed description taken in conjunction with the accompanying drawings.

FIG. 4 illustrates a diagram for describing a performance of the local sense amplifier circuit of FIG. 1.

DETAILED DESCRIPTION

Figure 1:
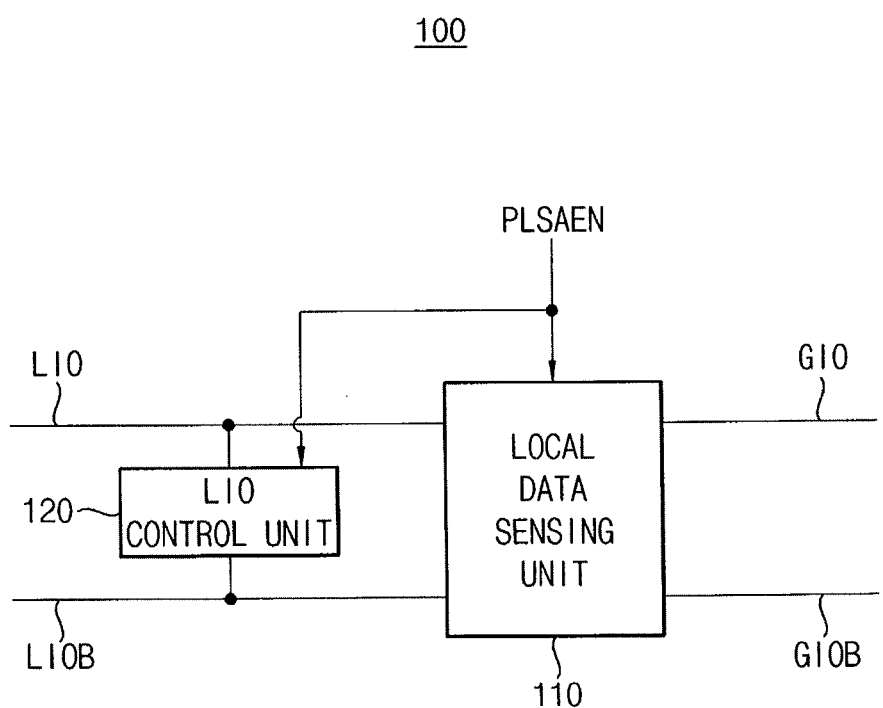
FIG. 1 illustrates a block diagram of a local sense amplifier circuit according to some example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. In the drawing figures, the dimensions of layers and regions may be exaggerated for clarity of illustration. Like reference numerals refer to like elements throughout.

It will be understood that, although the terms first, second, etc., may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more others.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As described herein, some example embodiments provide a local sense amplifier circuit capable of effectively sensing a voltage difference between a local input/output (I/O) line pair, and some example embodiments provide a semiconductor memory device including the local sense amplifier circuit.

FIG. 1 is a block diagram illustrating a local sense amplifier circuit according to some example embodiments.

In the example shown in FIG. 1, a local sense amplifier circuit 100 includes a local data sensing unit 110 and a local input/output (I/O) line control unit (LIO control unit) 120.

The local data sensing unit 110 is connected to a local I/O line pair LIO and LIOB, and is connected to a global I/O line pair GIO and GIOB. The local data sensing unit 110 amplifies a voltage difference between the local I/O line pair LIO and LIOB based on a local sensing enable signal PLSAEN to provide the amplified voltage difference to the global I/O line pair GIO and GIOB. As will be described in detail below with reference to FIG. 6, the local I/O line pair LIO and LIOB is precharged to a predetermined voltage level in an initial read operation time of a semiconductor memory device including the local sense amplifier circuit 100. When a column selection signal is activated, that is, when a corresponding memory cell (not illustrated) is selected, a voltage difference between a bitline pair is provided to the local I/O line pair LIO and LIOB, and a voltage difference between the local I/O line pair LIO and LIOB is caused. After the column selection signal is activated, the local sensing enable signal PLSAEN is activated. The local data sensing unit 110 may sense and amplify the voltage difference between the local I/O line pair LIO and LIOB to provide the amplified voltage difference to the global I/O line pair GIO and GIOB when the local sensing enable signal PLSAEN is activated.

The local I/O line pair LIO and LIOB may include a first local I/O line LIO and a second local I/O line LIOB. The first local I/O line LIO may be referred to as a local I/O line and the second local I/O line LIOB may be referred to as a complementary local I/O line. The global I/O line pair GIO and GIOB may include a first global I/O line GIO and a second global I/O line GIOB. The first global I/O line GIO may be referred to as a global I/O line and the second global I/O line GIOB may be referred to as a complementary global I/O line.

The local I/O line control unit 120 increases voltage levels of the local I/O line pair LIO and LIOB based on the local sensing enable signal PLSAEN. As described above, when the column selection signal is activated, the voltage difference between the local I/O line pair LIO and LIOB is caused, and the local sensing enable signal PLSAEN is activated. The local I/O line control unit 120 may increase the voltage levels of the local I/O line pair LIO and LIOB when the local sensing enable signal PLSAEN is activated, and thus the local data sensing unit 110 may effectively sense and amplify the voltage difference between the local I/O line pair LIO and LIOB.

The local I/O line control unit 120 includes a first capacitor and a second capacitor. The first capacitor increases a voltage level of the first local I/O line LIO in response to the local sensing enable signal PLSAEN. The second capacitor increases a voltage level of the second local I/O line LIOB in response to the local sensing enable signal PLSAEN. As will be described in detail below with reference to FIGS. 2 and 5, each capacitor may be implemented with a metal oxide semiconductor (MOS) transistor.

Typically, a gain of a local sense amplifier circuit is not determined depending on a voltage difference of a local I/O line pair, but is determined depending on voltage levels of the local I/O line pair. For example, the gain of the local sense amplifier circuit increases as a voltage level of a local I/O line having relatively high voltage level (i.e., a high voltage level of the local I/O line pair) increases. However, as a semiconductor memory device becomes more highly integrated, a gap between the local I/O line pairs decreases, and a coupling phenomenon between the local I/O line pairs may be caused. With such a coupling phenomenon, the local sense amplifier circuit may not operate normally, the voltage levels of the local I/O line pair may decrease (i.e., coupled-down), and the gain of the local sense amplifier circuit may decrease. Thus, a gain of an I/O sense amplifier circuit may decrease, and a semiconductor memory device may have relatively low operation speed, low operation reliability, and low operation stability. A precharge voltage level of the local I/O line pair may be increased to increase the high voltage level of the local I/O line pair in a general local sense amplifier circuit. However, when the precharge voltage level of the local I/O line pair increases, disturbance of bitline pairs may be caused, and thus a performance of the semiconductor memory device may be degraded.

In the local sense amplifier circuit 100 according to some example embodiments, the local I/O line control unit 120 includes the first and second capacitors that increase (i.e., couple-up) the voltage levels of the local I/O line pair LIO and LIOB. The local sense amplifier circuit 100 may have relatively high gain without increasing a precharge voltage level of the local I/O line pair LIO and LIOB, thereby preventing the disturbance of the bitline pairs. Thus, an I/O sense amplifier circuit that is connected to the global I/O line pair GIO and GIOB may have relatively high gain, and a semiconductor memory device including the local sense amplifier circuit 100 may have a relatively high operation speed, high operation reliability, and high operation stability. In addition, the local I/O line control unit 120 is driven based on the local sensing enable signal PLSAEN that drives the local data sensing unit 110, and thus the voltage levels of the local I/O line pair LIO and LIOB may be controlled without an additional timing control signal.

Figure 2:
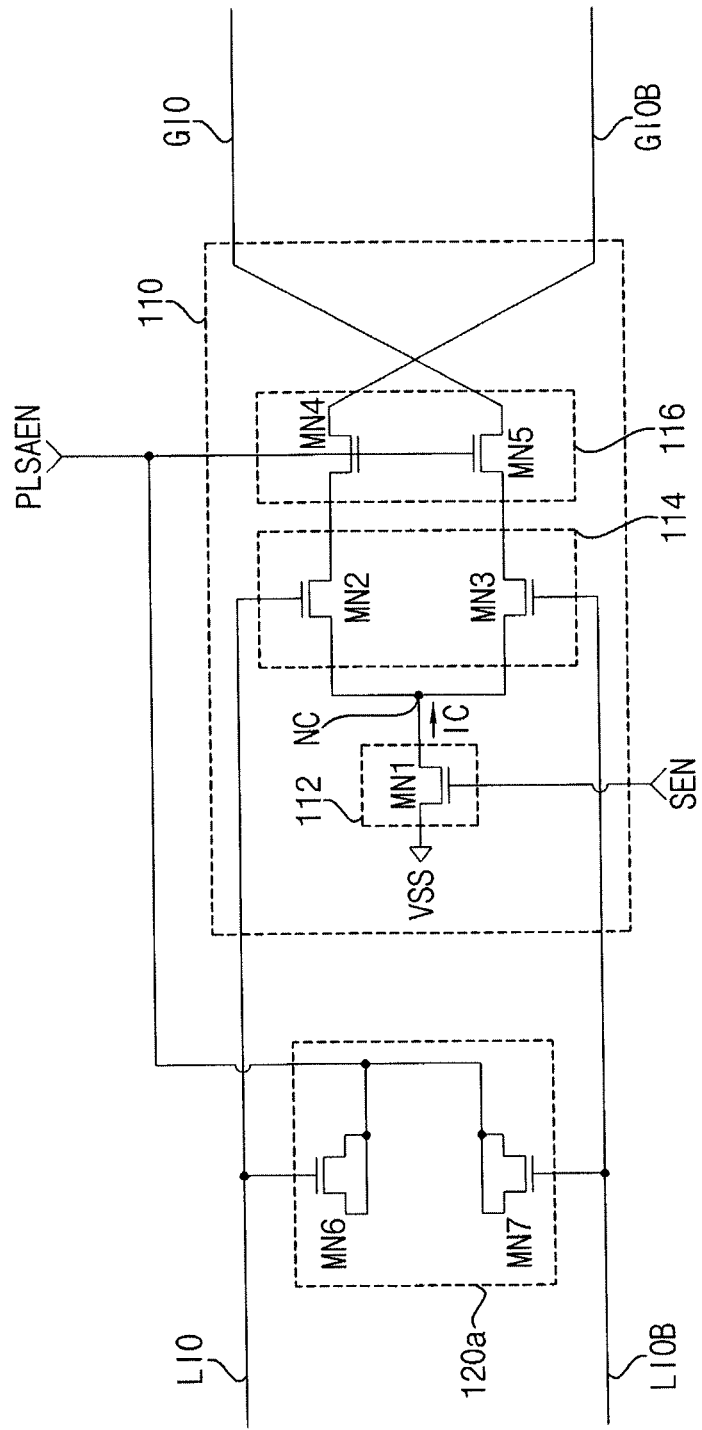
FIG. 2 illustrates a circuit diagram of an example of the local sense amplifier circuit of FIG. 1.

FIG. 2 is a circuit diagram illustrating an example of the local sense amplifier circuit of FIG. 1.

In the example shown in FIG. 2, a local sense amplifier circuit 100a includes the local data sensing unit 110 and a local I/O line control unit 120a.

The local data sensing unit 110 may include a sensing control block 112, a sensing block 114, and an output block 116.

The sensing control block 112 may control a sensing operation of the sensing block 114 and an amplifying operation of the output block 116 in response to a selection enable signal SEN. The sensing control block 112 may be implemented with a current source. For example, the sensing control block 112 may include a first MOS transistor MN1. The first MOS transistor MN1 may have a first electrode receiving a ground voltage VSS, a gate electrode receiving the selection enable signal SEN, and a second electrode connected to a control node NC. The sensing control block 112 may generate a sensing control current IC in response to the selection enable signal SEN. When the selection enable signal SEN is activated, the sensing block 114 may perform the sensing operation and the output block 116 may perform the amplifying operation based on the sensing control current IC. In an example embodiment, the selection enable signal SEN may be substantially the same as the local sensing enable signal PLSAEN.

The sensing block 114 may be connected to the local I/O line pair LIO and LIOB, and may sense the voltage difference between the local I/O line pair LIO and LIOB. The sensing block 114 may include a second MOS transistor MN2 and a third MOS transistor MN3. The second MOS transistor MN2 may have a first electrode connected to the control node NC, a gate electrode connected to the first local I/O line LIO, and a second electrode. The third MOS transistor MN3 may have a first electrode connected to the control node NC, a gate electrode connected to the second local I/O line LIOB, and a second electrode.

The output block 116 may amplify the sensed voltage difference in response to the local sensing enable signal PLSAEN to provide the amplified voltage difference to the global I/O line pair GIO and GIOB. The output block 116 may include a fourth MOS transistor MN4 and a fifth MOS transistor MN5. The fourth MOS transistor MN4 may have a first electrode connected to the second electrode of the second MOS transistor MN2, a gate electrode receiving the local sensing enable signal PLSAEN, and a second electrode connected to the second global I/O line GIOB. The fifth MOS transistor MN5 may have a first electrode connected to the second electrode of the third MOS transistor MN3, a gate electrode receiving the local sensing enable signal PLSAEN, and a second electrode connected to the first global I/O line GIO.

The local I/O line control unit 120a may include the first capacitor and the second capacitor. The first capacitor may be implemented with a MOS capacitor (e.g., a MOS transistor MN6). The MOS transistor MN6 may have a gate electrode connected to the first local I/O line LIO, a first electrode receiving the local sensing enable signal PLSAEN, and a second electrode connected to the first electrode of the MOS transistor MN6. The second capacitor may be implemented with a MOS capacitor (e.g., a MOS transistor MN7). The MOS transistor MN7 may have a gate electrode connected to the second local I/O line LIOB, a first electrode receiving the local sensing enable signal PLSAEN, and a second electrode connected to the first electrode of the MOS transistor MN7.

Although the local sense amplifier circuit 100a including n-type MOS (NMOS) transistors MN1, . . . , MN7 is illustrated in FIG. 2, it may be implemented in various ways.

As described above, the local I/O line control unit 120a may include the MOS capacitors that store charges based on the local sensing enable signal PLSAEN, and thus local sense amplifier circuit 100a may increase the voltage levels of the local I/O line pair LIO and LIOB without an additional timing control signal.

Figure 3A:
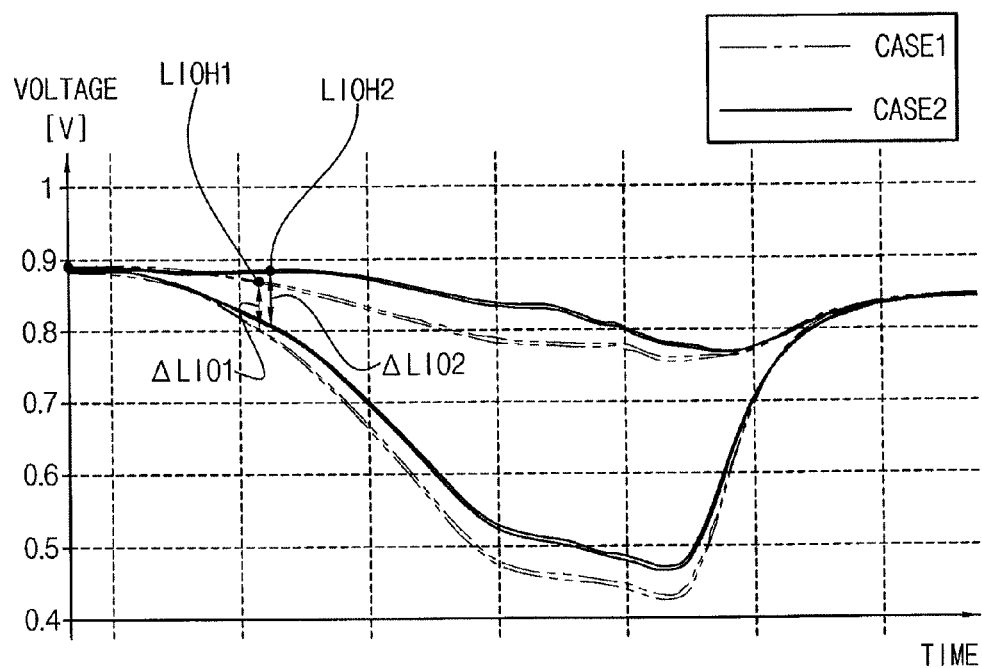
FIGS. 3A and 3B illustrate diagrams for describing operations of the local sense amplifier circuit of FIG. 1.
Figure 3B:
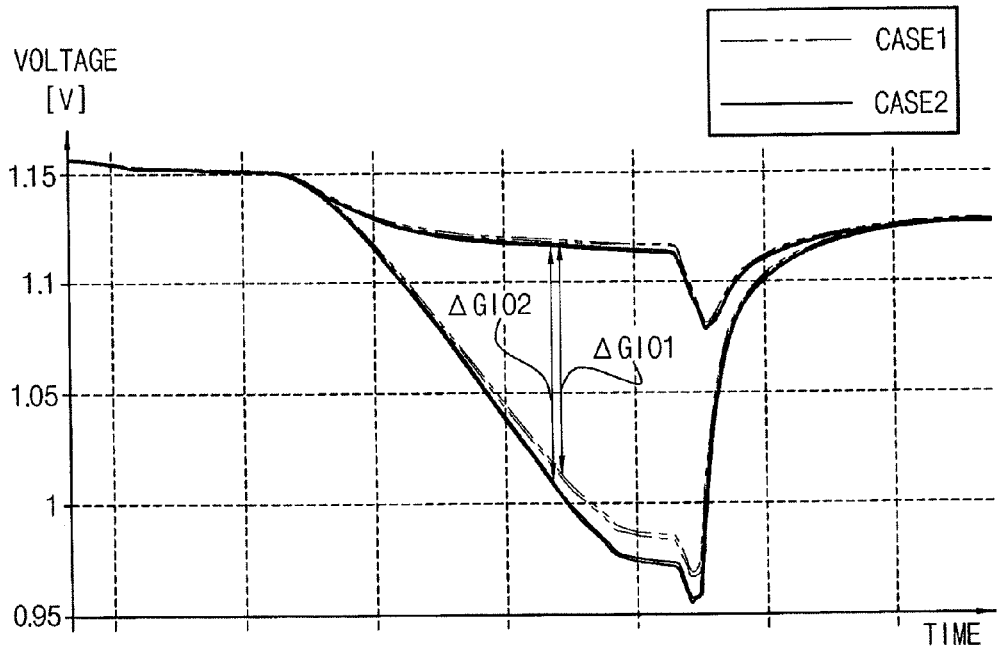

FIGS. 3A and 3B are diagrams for describing operations of the local sense amplifier circuit of FIG. 1. FIG. 3A is a graph illustrating variations of the voltage levels of the local I/O line pair according to an operation of the local sense amplifier circuit. FIG. 3B is a graph illustrating variations of the voltage levels of the global I/O line pair according to the operation of the local sense amplifier circuit. In FIGS. 3A and 3B, CASE1 indicates variations of the voltage levels of the I/O line pairs in a general local sense amplifier circuit, whereas CASE2 indicates variations of the voltage levels of the I/O line pairs in the local sense amplifier circuit 100 according to an example embodiment, the local sense amplifier circuit 100 including the local I/O line control unit 120.

Referring to FIGS. 1, 2 and 3A, in an initial operation time, both of a local I/O line pair in the general local sense amplifier circuit and the local I/O line pair LIO and LIOB in the local sense amplifier circuit 100 are precharged to a local precharge voltage level. For example, the local precharge voltage level may be about 0.85V. When the column selection signal is activated, a voltage difference ΔLIO1 between the local I/O line pair in the general local sense amplifier circuit and a voltage difference ΔLIO2 between the local I/O line pair LIO and LIOB in the local sense amplifier circuit 100 are caused based on a voltage difference between a bitline pair, respectively.

If a memory cell stores data corresponding to "1", the voltage level of the first local I/O line LIO may be higher than the voltage level of the second local I/O line LIOB. The voltage difference ΔLIO1 between the general local I/O line pair may be substantially the same as the voltage difference ΔLIO2 between the local I/O line pair LIO and LIOB in the local sense amplifier circuit 100. However, since the local I/O line control unit 120 increases voltage levels of the local I/O line pair LIO and LIOB by using the first and second capacitors and the local sensing enable signal PLSAEN, the voltage levels of the local I/O line pair LIO and LIOB in the local sense amplifier circuit 100 are higher than the voltage levels of the conventional local I/O line pair. For example, a voltage level LIOH1 of the first local I/O line LIO (i.e., a high voltage level of the local I/O line pair LIO and LIOB in the local sense amplifier circuit 100) may be higher than a voltage level LIOH2 of the first general local I/O line (i.e., a high voltage level of the conventional local I/O line pair) by about 20 mV. Thus, the local sense amplifier circuit 100 may have relatively high gain.

Referring to FIGS. 1, 2 and 3B, in an initial operation time, both of a global I/O line pair in the general local sense amplifier circuit and the global I/O line pair GIO and GIOB in the local sense amplifier circuit 100 are precharged to a global precharge voltage level. For example, the global precharge voltage level may be about 1.15V. When the local sensing enable signal PLSAEN is activated, a voltage difference ΔGIO1 between the global I/O line pair in the general local sense amplifier circuit and a voltage difference ΔGIO2 between the global I/O line pair GIO and GIOB in the local sense amplifier circuit 100 are caused based on the voltage difference ΔLIO1 between the conventional local I/O line pair and the voltage difference ΔLIO2 between the local I/O line pair LIO and LIOB, respectively.

If a memory cell stores data corresponding to "1", the voltage level of the first global I/O line GIO may be higher than the voltage level of the second global I/O line GIOB. For example, the second MOS transistor MN2 in FIG. 2 may be turned on, the third MOS transistor MN3 in FIG. 2 may be turned off, the ground voltage VSS may be applied to the second global I/O line GIOB, and a voltage level of the second global I/O line GIOB may decrease. As described above, since the gain of the local sense amplifier circuit 100 is higher than a gain of the general local sense amplifier circuit, the voltage level of the second global I/O line GIOB may decrease more than a voltage level of a second global I/O line in the general local sense amplifier circuit. That is, a magnitude of a pull-down slope of the second global I/O line GIOB is larger than a magnitude of a pull-down slope of the general second global I/O line, and the voltage difference ΔGIO2 between the global I/O line pair GIO and GIOB is larger than the voltage difference ΔGIO1 between the general global I/O line pair. For example, the voltage difference ΔGIO2 between the global I/O line pair GIO and GIOB is larger than the voltage difference ΔGIO1 between the general global I/O line pair by about 10 mV. Thus, the semiconductor memory device including the local sense amplifier circuit 100 may have a relatively high operation speed, high operation reliability, and high operation stability.

FIG. 4 is a diagram for describing a performance of the local sense amplifier circuit of FIG. 1. In FIG. 4, CASE1 indicates a distribution of the voltage differences between the general global I/O line pair, and CASE2 indicates a distribution of the voltage differences between the global I/O line pair GIO and GIOB in the local sense amplifier circuit 100 according to an example embodiment.

Referring to FIG. 4, the voltage difference between the general global I/O line pair may have an average value of about 0.106V and a variance value of about 0.000029. The voltage difference between the global I/O line pair GIO and GIOB in the local sense amplifier circuit 100 may have an average value of about 0.110V and a variance value of about 0.000027. Thus, the local sense amplifier circuit 100 according to some example embodiments may have a relatively large voltage difference between the global I/O line pair GIO and GIOB, and a relatively high gain.

Figure 5:
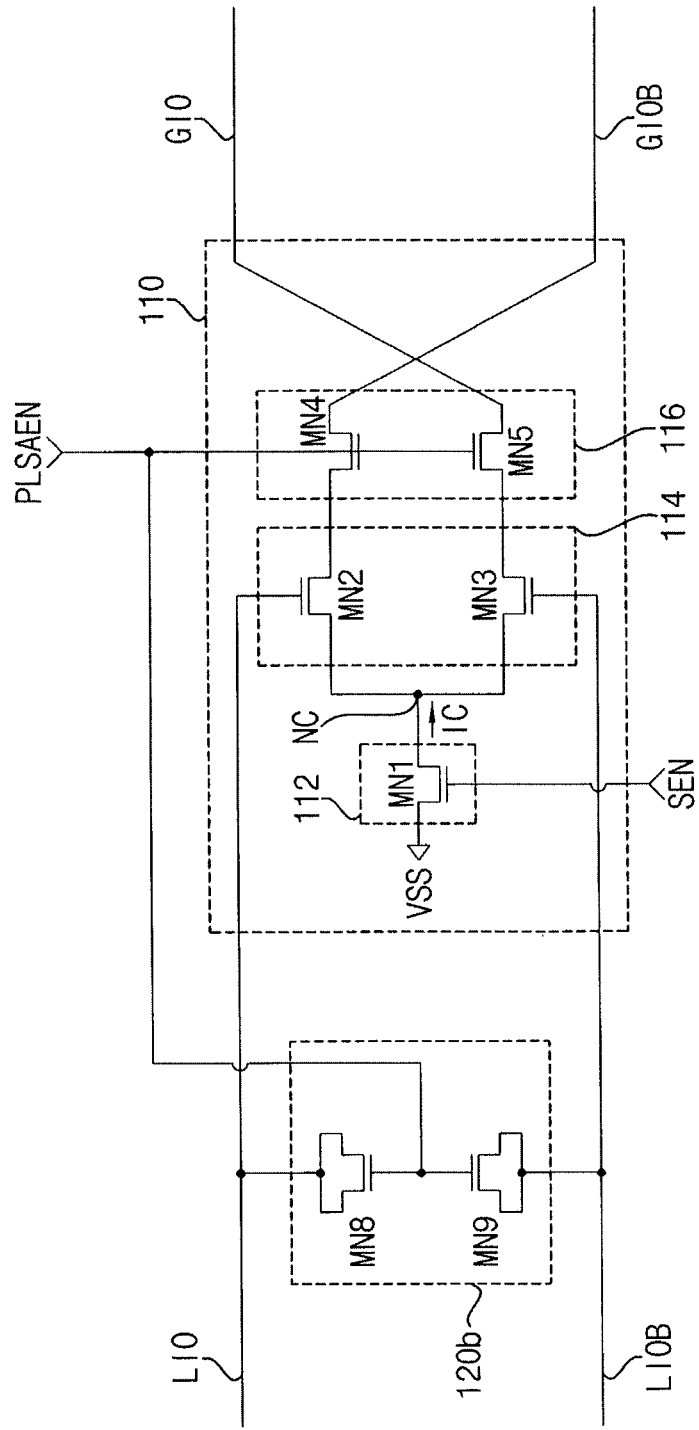
FIG. 5 illustrates a circuit diagram of another example of the local sense amplifier circuit of FIG. 1.

FIG. 5 is a circuit diagram illustrating another example of the local sense amplifier circuit of FIG. 1.

In the example shown in FIG. 5, a local sense amplifier circuit 100b includes the local data sensing unit 110 and a local I/O line control unit 120b.

In comparison with the local sense amplifier circuit 100a of FIG. 2, the local sense amplifier circuit 100b includes the local I/O line control unit 120b instead of the local I/O line control unit 120a. The local data sensing unit 110 in FIG. 5 may be substantially the same as the local data sensing unit 110 in FIG. 2. Thus, in FIG. 5, the same reference numerals will be used to refer the same or like elements in FIG. 2, and further explanation will not be repeated.

The local I/O line control unit 120b may include the first capacitor and the second capacitor. The first capacitor may be implemented with a MOS capacitor (e.g., a MOS transistor MN8). The MOS transistor MN8 may have a gate electrode receiving the local sensing enable signal PLSAEN, a first electrode connected to the first local I/O line LIO, and a second electrode connected to the first electrode of the MOS transistor MN8. The second capacitor may be implemented with a MOS capacitor (e.g., a MOS transistor MN9). The MOS transistor MN9 may have a gate electrode receiving the local sensing enable signal PLSAEN, a first electrode connected to the second local I/O line LIOB, and a second electrode connected to the first electrode of the MOS transistor MN9.

Figure 6:
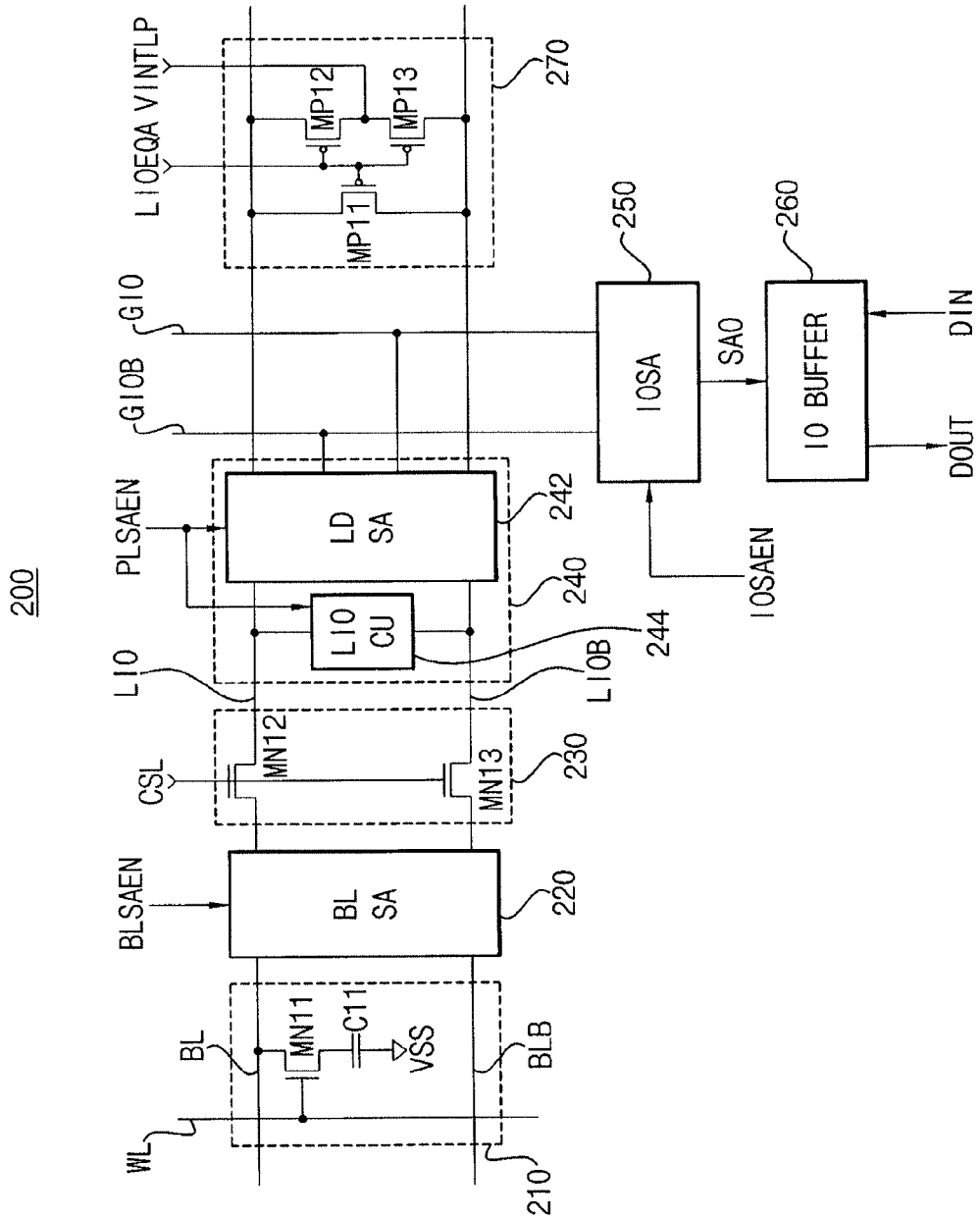
FIG. 6 illustrates a block diagram of a semiconductor memory device according to some example embodiments.

FIG. 6 is a block diagram illustrating a semiconductor memory device according to some example embodiments.

In the example shown in FIG. 6, a semiconductor memory device 200 includes a memory cell array 210, a bitline sense amplifier circuit (BLSA) 220, a column selection circuit 230, a local sense amplifier circuit 240, and an input/output (I/O) sense amplifier circuit. The semiconductor memory device 200 may further include an I/O buffer 260 and a local I/O line precharge control circuit 270.

The memory cell array 210 is connected to a bitline pair BL and BLB. The bitline pair may include a first bitline BL and a second bitline BLB. The first bitline BL may be referred to as a bitline, and the second bitline BLB may be referred to as a complementary bitline. The memory cell array 210 may include a plurality of memory cells that store data. Each memory cell may include a first transistor MN11 and a capacitor C11. The first transistor MN11 may be a NMOS transistor, and may have a gate electrode connected to a wordline WL, a first electrode connected to the first bitline BL, and a second electrode. The capacitor C11 may have a first end connected to the second electrode of the first transistor MN11 and a second end connected to the ground voltage VSS. Although the memory cell connected to the first bitline BL is illustrated in FIG. 6, the memory cell may be connected to the second bitline BLB.

The bitline sense amplifier circuit 220 amplifies a voltage difference between the bitline pair BL and BLB based on a bitline sensing enable signal BLSAEN. The bitline sense amplifier circuit 220 may include a precharge unit for precharging the bitline pair BL and BLB and an amplifying unit for sensing and amplifying the voltage difference between the bitline pair BL and BLB. The bitline sense amplifier circuit 220 may be implemented with a self-precharge scheme performing an adaptive precharge operation or a pre-sensing scheme performing a pre-sensing operation with an additional sensing voltage.

The column selection circuit 230 provides the amplified voltage difference between the bitline pair BL and BLB to a local I/O line pair LIO and LIOB in response to a column selection signal CSL. For example, the column selection circuit 230 may selectively connect the bitline pair BL and BLB with the local I/O line pair LIO and LIOB in response to the column selection signal CSL. The column selection circuit 230 may include a second transistor MN12 and a third transistor MN13. The second transistor MN12 may have a gate electrode receiving the column selection signal CSL, a first electrode connected to the first bitline BL, and a second electrode connected to a first local I/O line LIO. The third transistor MN13 may have a gate electrode receiving the column selection signal CSL, a first electrode connected to the second bitline BLB, and a second electrode connected to a second local I/O line LIOB.

The local sense amplifier circuit 240 may be the local sense amplifier circuit 100 of FIG. 1. The local sense amplifier circuit 240 amplifies a voltage difference between the local I/O line pair LIO and LIOB based on the local sensing enable signal PLSAEN to provide the amplified voltage difference between the local I/O line pair LIO and LIOB to a global I/O line pair GIO and GIOB. The local sense amplifier circuit 240 includes a first capacitor and a second capacitor. The first capacitor increases a voltage level of the first local I/O line LIO based on the local sensing enable signal PLSAEN. The second capacitor increases a voltage level of the second local I/O line LIOB based on the local sensing enable signal PLSAEN. The local sense amplifier circuit 240 may include a local data sensing unit (LDSA) 242 performing such amplifying operation and a local I/O line control unit (LIOCU) 244 performing such increasing operation.

In an example embodiment, the local sense amplifier circuit 240 may increase the voltage levels of the local I/O line pair LIO and LIOB when the semiconductor memory device 200 reads out the data stored in the memory cell array 210.

In an example embodiment, the memory cell array 210, the bitline sense amplifier circuit 220, the column selection circuit 230, and the local sense amplifier circuit 240 may form a memory core in the semiconductor memory device 200. The memory core may further include a row decoder (not illustrated) for selecting a wordline of the memory cell array 210 by decoding a row address, and a column decoder (not illustrated) for selecting at least one bit line of the memory cell array 210 by decoding a column address.

An I/O sense amplifier circuit (IOSA) 250 amplifies a voltage difference between the global I/O line pair GIO and GIOB based on an I/O sensing enable signal IOSAEN to generate a sensing output signal SAO. The I/O sense amplifier circuit 250 may include a current sense amplifier or a voltage sense amplifier. For example, the I/O sense amplifier circuit 250 may amplify the voltage difference between the global I/O line pair GIO and GIOB with current mode or voltage mode.

The I/O buffer 260 may generate output data DOUT based on the sensing output signal SAO. For example, the I/O buffer 260 may perform a parallel-to-serial conversion operation on the sensing output signal SAO to generate the output data DOUT. The I/O buffer 260 may receive input data DIN from an external device (not illustrated) such as a memory controller. The input data DIN may be stored in the memory cell array 210 through the I/O sense amplifier circuit 250, the local sense amplifier circuit 240, and the bitline sense amplifier circuit 220.

The local I/O line precharge control circuit 270 may precharge the local I/O line pair LIO and LIOB based on a precharge control signal LIOEQA and a precharge voltage VINTLP. The local I/O line precharge control circuit 270 may include a fourth transistor MP11, a fifth transistor MP12, and a sixth transistor MP13. The fourth, fifth, and sixth transistors MP11, MP12, and MP13 may be PMOS transistors, respectively. The fourth transistor MP11 may have a first electrode connected to the first local I/O line LIO, a gate electrode receiving the precharge control signal LIOEQA, and a second electrode connected to the second local I/O line LIOB. The fifth transistor MP12 may have a first electrode connected to the first local I/O line LIO, a gate electrode receiving the precharge control signal LIOEQA, and a second electrode receiving the precharge voltage VINTLP. The sixth transistor MP13 may have a first electrode connected to the second electrode of the fifth transistor MP12, a gate electrode receiving the precharge control signal LIOEQA, and a second electrode connected to the second local I/O line LIOB.

Although FIG. 6 illustrates one memory cell, one bitline pair, one local I/O line pair, and one global I/O line pair for convenience of illustration, the semiconductor memory device 200 may include a plurality of memory cells, a plurality of bitline pairs, a plurality of local I/O line pairs, and a plurality of global I/O line pairs that are hierarchically connected. For example, the memory cells may be connected to one bitline pair, the bitline pairs may be connected to one local I/O line pair, and the local I/O line pairs may be connected to one global I/O line pair. In addition, the semiconductor memory device 200 may include a plurality of bitline sense amplifier circuits, a plurality of local sense amplifier circuits, and a plurality of I/O sense amplifier circuits. Each bitline sense amplifier circuit may be connected between a respective one of the bitline pairs and a respective one of the local I/O line pairs, each local sense amplifier circuit may be connected between a respective one of the local I/O line pairs and a respective one of the global I/O line pairs, and each I/O sense amplifier circuit may be connected to a respective one of the global I/O line pairs.

The semiconductor memory device 200 according to some example embodiments includes the local sense amplifier circuit 240 that has the first and second capacitors increasing the voltage levels of the local I/O line pair LIO and LIOB, and has a relatively high gain. Thus, the semiconductor memory device 200 may have a relatively high operation speed, high operation reliability, and high operation stability.

Figure 7:
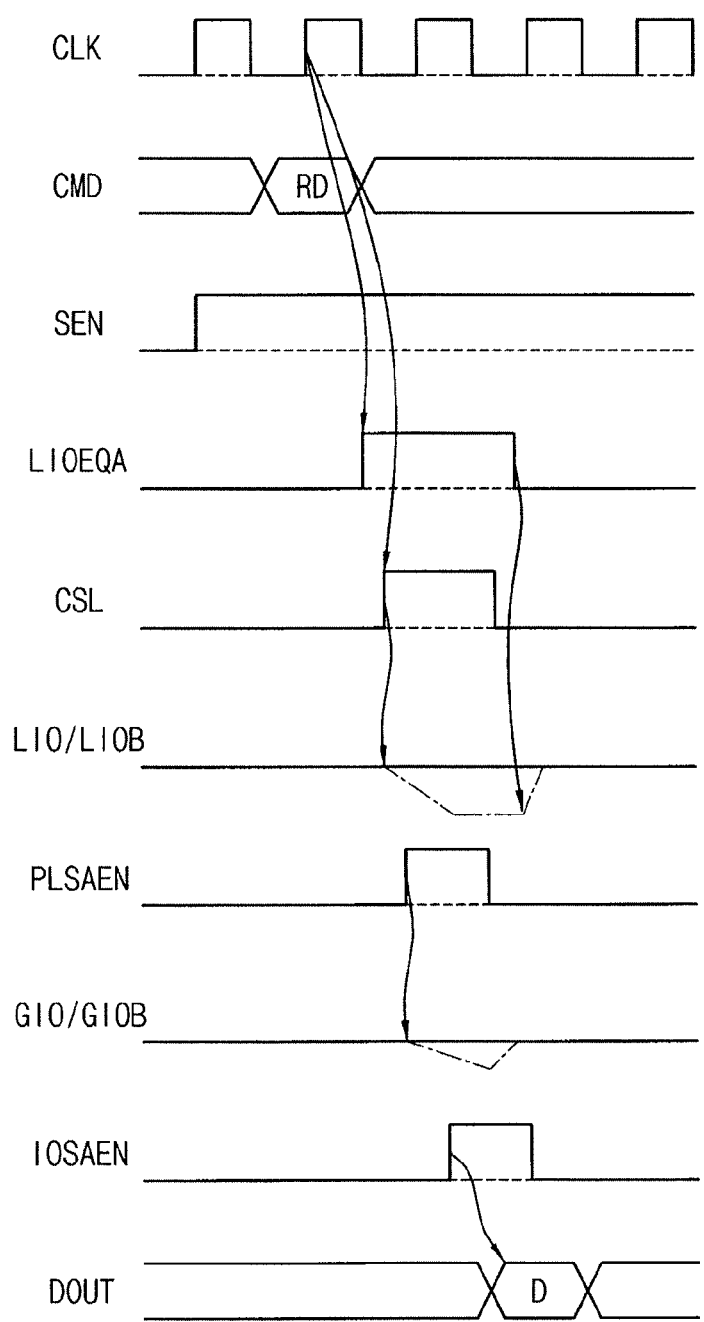
FIG. 7 illustrates a diagram for describing an operation of the semiconductor memory device of FIG. 6.

FIG. 7 is a diagram for describing an operation of the semiconductor memory device of FIG. 6. FIG. 7 represents a read operation of the semiconductor memory device 200 of FIG. 6.

Referring to FIGS. 2, 6 and 7, the semiconductor memory device 200 operates in a read mode based on a clock signal CLK and a command signal CMD. The semiconductor memory device 200 may receive the clock signal CLK and the command signal CMD from an external device (e.g., a memory controller). In an initial read operation time, the local I/O line precharge control circuit 270 precharges the local I/O line pair LIO and LIOB to a level of the precharge voltage VINTLP based on the precharge control signal LIOEQA. The global I/O line pair GIO and GIOB is precharged to a global precharge level by a global I/O line precharge control circuit (not illustrated).

The selection enable signal SEN is activated before the column selection signal CSL and the local sensing enable signal PLSAEN are activated. If the command signal CMD corresponds to a read command RD, the precharge control signal LIOEQA is transitioned from a logic low level to a logic high level in response to an edge (e.g., a rising edge) of the clock signal CLK, and the precharge operation for the local I/O line pair LIO and LIOB is finished. The column selection signal CSL is activated (i.e., transitioned from the logic low level to the logic high level) in response to the edge (e.g., the rising edge) of the clock signal CLK. The column selection circuit 230 provides the voltage difference between the bitline pair BL and BLB that is amplified by the bitline sense amplifier circuit 220 to the local I/O line pair LIO and LIOB in response to the activated column selection signal CSL.

The local sensing enable signal PLSAEN is activated after the column selection signal CSL is activated. The local I/O line control unit 244 in the local sense amplifier circuit 240 increases the voltage levels of the local I/O line pair LIO and LIOB based on the activated local sensing enable signal PLSAEN. The local data sensing unit 242 in the local sense amplifier circuit 240 amplifies the voltage difference between the local I/O line pair LIO and LIOB based on the local sensing enable signal PLSAEN to provide the amplified voltage difference between the local I/O line pair LIO and LIOB to the global I/O line pair GIO and GIOB. Variations of the voltage levels of the local I/O line pair LIO and LIOB and the global I/O line pair GIO and GIOB in FIG. 7 may be substantially the same as the variations of the voltage levels of the local I/O line pair LIO and LIOB and the global I/O line pair GIO and GIOB of CASE2 in FIGS. 3A and 3B.

The I/O sensing enable signal IOSAEN is activated after the local sensing enable signal PLSAEN is activated. The I/O sense amplifier circuit 250 amplifies the voltage difference between the global I/O line pair GIO and GIOB based on the activated I/O sensing enable signal IOSAEN to generate a sensing output signal SAO. The I/O buffer 260 generates the output data DOUT based on the sensing output signal SAO. The output data DOUT may be substantially the same as data stored in the memory cell. The local sensing enable signal PLSAEN and the column selection signal CSL are sequentially deactivated. The precharge control signal LIOEQA is transitioned from the logic high level to the logic low level, and the local I/O line pair LIO and LIOB is re-precharged for a subsequent read operation.

Figure 8:
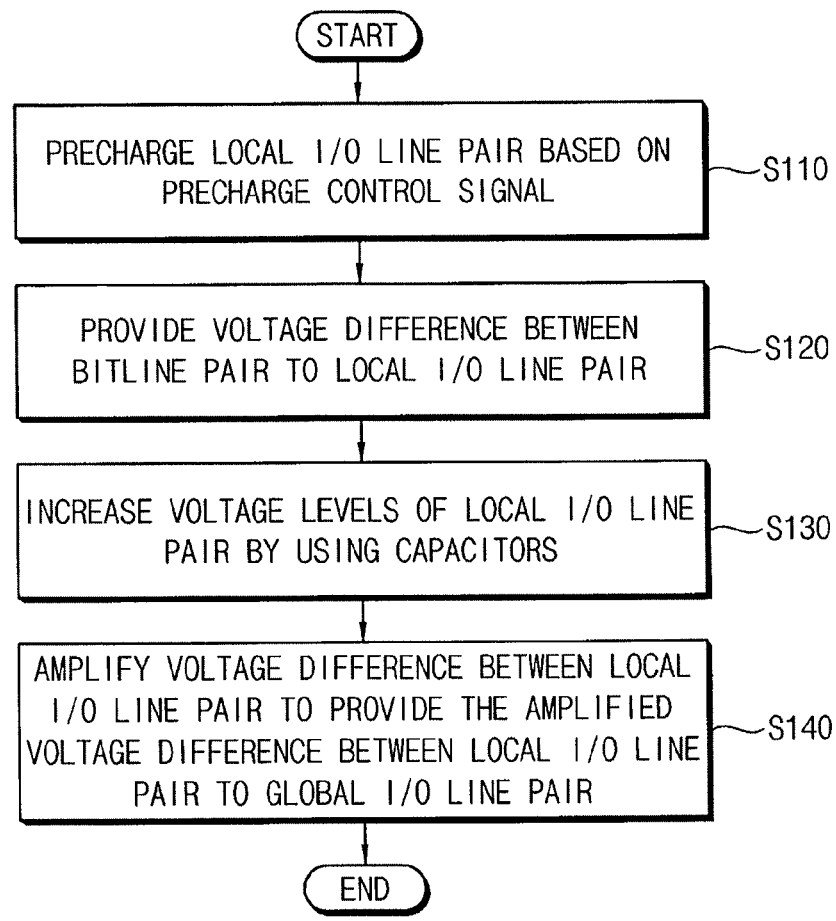
FIG. 8 illustrates a flow chart of a method of operating a local sense amplifier circuit according to some example embodiments.

FIG. 8 is a flow chart illustrating a method of operating a local sense amplifier circuit according to some example embodiments.

Referring to FIGS. 1, 6 and 8, in the method of operating the local sense amplifier circuit 100 according to some example embodiments, the local I/O line pair LIO and LIOB is precharged to the level of the precharge voltage VINTLP based on the precharge control signal LIOEQA (operation S110). The voltage difference between the bitline pair BL and BLB is provided to the local I/O line pair LIO and LIOB in response to the column selection signal CSL (operation S120). The voltage levels of the local I/O line pair LIO and LIOB is increased by using capacitors that are connected to the local I/O line pair LIO and LIOB (operation S130). The voltage difference between the local I/O line pair LIO and LIOB is amplified based on the local sensing enable signal PLSAEN to provide the amplified voltage difference between the local I/O line pair LIO and LIOB to the global I/O line pair GIO and GIOB (operation S140).

In the method of operating the local sense amplifier circuit 100 according to some example embodiments, the voltage levels of the local I/O line pair LIO and LIOB is increased by using capacitors (e.g., two capacitors included in the local I/O line control unit 120), and thus the local sense amplifier circuit 100 may have relatively improved sensing performance.

Figure 9:
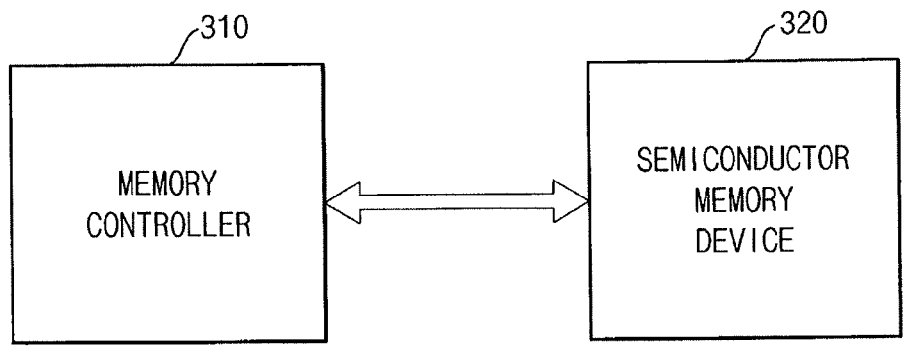
FIG. 9 illustrates a block diagram of a memory system according to some example embodiments.

FIG. 9 is a block diagram illustrating a memory system according to some example embodiments.

Referring to FIG. 9, a memory system 300 includes a memory controller 310 and a semiconductor memory device 320. Although not illustrated in FIG. 9, the memory system 300 may further include a plurality of interfaces for communicating with an external device or a user.

The memory controller 310 controls I/O operations of the semiconductor memory device 320. The memory controller 310 generates a plurality of control signals such as a clock signal, a command signal, an address signal, a data strobe signal, etc. The semiconductor memory device 320 reads data in a memory cell or writes data to the memory cell. The semiconductor memory device 320 may be the semiconductor memory device 200 of FIG. 6. For example, semiconductor memory device 320 may include a local sense amplifier circuit that increases voltage levels of a local I/O line pair by using capacitors connected to the local I/O line pair, thereby having a relatively high operation speed, high operation reliability and high operation stability.

Figure 10:
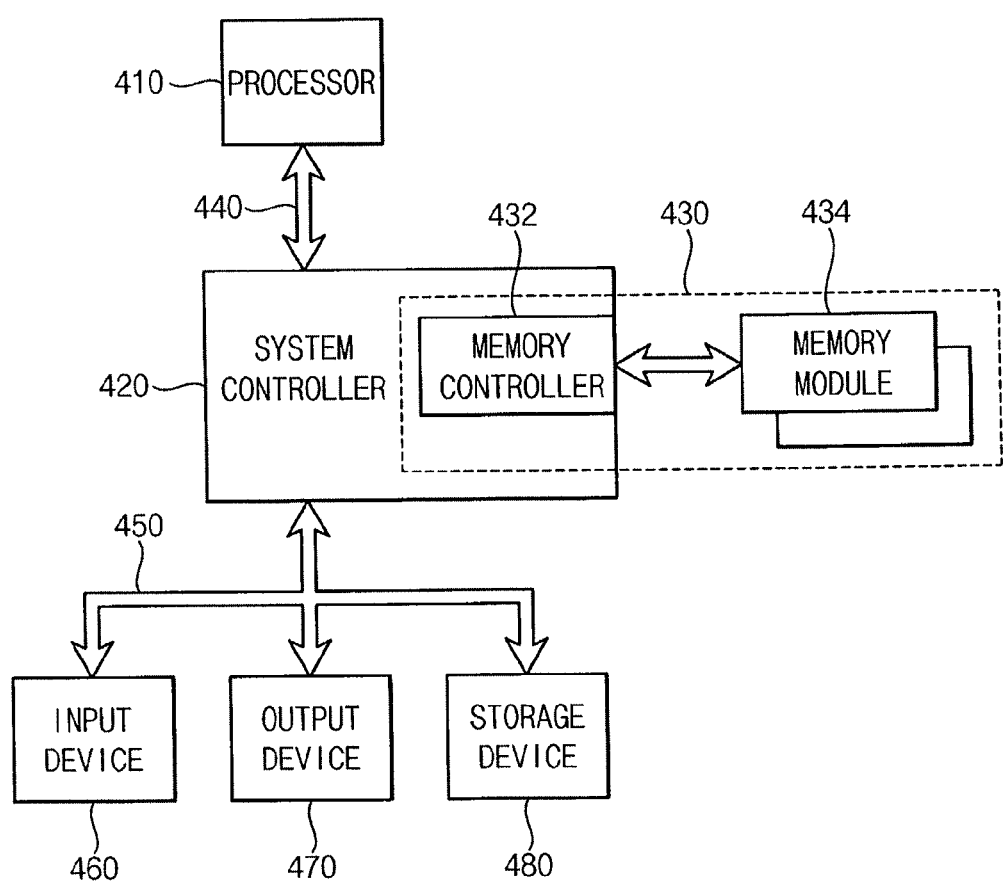
FIG. 10 illustrates a block diagram of a computing system according to an exemplary embodiment.

FIG. 10 is a block diagram illustrating a computing system according to an exemplary embodiment.

Referring to FIG. 10, a computing system 400 includes a processor 410, a system controller 420, and a memory system 430. The computing system 400 may further include a processor bus 440, an extension bus 450, an input device 460, an output device 470, and a storage device 480. The memory system 430 may include at least one memory module 434, and a memory controller 432 for controlling the memory module 434. The memory controller 432 may be included in the system controller 420.

The processor 410 may perform various computing functions, such as executing specific software for performing specific calculations or tasks. For example, the processor 410 may be a microprocessor, a central processing unit (CPU), a digital signal processor, or the like. The processor 410 may be connected to the system controller 420 via the processor bus 440 including an address bus, a control bus, and/or a data bus. The system controller 420 may be connected to the expansion bus 450, such as a peripheral-component-interconnect (PCI) bus. The processor 410 may control the input device 460 (such as a keyboard or a mouse), the output device 470 (such as a printer or a display device), and the storage device 480 (such as a hard disk drive, a compact disk read-only memory (CD-ROM), or a solid state drive (SSD)).

The memory controller 432 may control the memory module 434 to perform a command provided from the processor 410. The memory module 434 may store data provided from the memory controller 432, and may provide the stored data to the memory controller 432. The memory module 434 may include a plurality of semiconductor memory devices and each of the plurality of semiconductor memory devices may be the semiconductor memory device 200 of FIG. 6. For example, each of the plurality of semiconductor memory devices may include at least one of a dynamic random access memory (DRAM), a static random access memory (SRAM), a non-volatile memory, etc. Each semiconductor memory device may include a local sense amplifier circuit that increases voltage levels of a local I/O line pair by using capacitors connected to the local I/O line pair, thereby having relatively high operation speed, high operation reliability, and high operation stability.

The computing system 400 may be applicable to a desktop computer, a notebook, a computer, a work station, a handheld device, or the like.

The above described embodiments may be applied to a system having a semiconductor memory device. Thus, the present inventive concept may be applied to a system, such as a desktop computer, a laptop computer, a digital camera, a video camcorder, a cellular phone, a smart phone, a portable multimedia player (PMP), a personal digital assistant (PDA), an MP3 player, a digital television, a solid state drive (SSD), a navigation device, etc.

By way of summation and review, a semiconductor memory device may have a hierarchical structure of data input/output (I/O) lines to read data stored in a memory cell or write data to the memory cell. For example, the semiconductor memory device may include the memory cell, a bitline pair connected to the memory cell, a local I/O line pair connected to the bitline pair, and a global I/O line pair connected to the local I/O line pair. A sense amplifier circuit may be used during a data I/O procedure in the semiconductor memory device, and may include a bitline sense amplifier circuit amplifying a voltage difference of the bitline pair, a local sense amplifier circuit amplifying a voltage difference of the local I/O line pair, and an I/O sense amplifier circuit amplifying a voltage difference of the global I/O line pair.

Typically, a gain of a local sense amplifier circuit is not determined depending on a voltage difference of a local I/O line pair, but is instead determined depending on voltage levels of the local I/O line pair. For example, the gain of the local sense amplifier circuit increases as a voltage level of a local I/O line having relatively high voltage level (i.e., a high voltage level of the local I/O line pair) increases. However, a gap between the local I/O line pairs decreases as a semiconductor memory device becomes more highly integrated, and a coupling phenomenon between the local I/O line pairs may be caused. With such a coupling phenomenon, the local sense amplifier circuit may not operate normally, the voltage levels of the local I/O line pair may decrease (i.e., be coupled-down), and the gain of the local sense amplifier circuit may decrease. Thus, a gain of an I/O sense amplifier circuit may decrease, and a semiconductor memory device may have a relatively low operation speed, low operation reliability and low operation stability. A scheme of increasing a precharge voltage level of the local I/O line pair to increase the high voltage level of the local I/O line pair has been proposed in a general local sense amplifier circuit, but increasing the precharge voltage level of the local I/O line pair may cause a disturbance of bitline pairs, degrading a performance of the semiconductor memory device. By comparison, in a local sense amplifier circuit according to some example embodiments, the local I/O line control unit includes the first and second capacitors that increase (i.e., couple-up) the voltage levels of the local I/O line pair. The local sense amplifier circuit may have a relatively high gain without increasing a precharge voltage level of the local I/O line pair, thereby preventing the disturbance of the bitline pairs. Thus, an I/O sense amplifier circuit that is connected to the global I/O line pair may have relatively high gain, and may effectively sense and amplify a voltage difference between the local I/O line pair. The local sense amplifier circuit according to some example embodiments may include first and second capacitors that increase voltage levels of a local I/O line pair. A semiconductor memory device including the local sense amplifier circuit may have relatively high operation speed, high operation reliability, and high operation stability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A local sense amplifier circuit in a semiconductor memory device, the local sense amplifier circuit comprising:
a local data sensing unit configured to amplify a voltage difference between a local input/output (I/O) line pair based on a local sensing enable signal to provide the amplified voltage difference to a global I/O line pair, the local I/O line pair including a first local I/O line and a second local I/O line; and
a local I/O line control unit including a first capacitor and a second capacitor, the first capacitor increasing a voltage level of the first local I/O line based on the local sensing enable signal, the second capacitor increasing a voltage level of the second local I/O line based on the local sensing enable signal,
wherein the first capacitor is a first metal oxide semiconductor (MOS) transistor that includes a gate electrode connected to the first local I/O line, a first electrode receiving the local sensing enable signal, and a second electrode connected to the first electrode of the first MOS transistor, and
wherein the second capacitor is a second MOS transistor that includes a gate electrode connected to the second local I/O line, a first electrode receiving the local sensing enable signal, and a second electrode connected to the first electrode of the second MOS transistor.

2. A local sense amplifier circuit, in a semiconductor memory device, the local sense amplifier circuit comprising:
a local data sensing unit configured to amplify a voltage difference between a local input/output (I/O) line pair based on a local sensing enable signal to provide the amplified voltage difference to a global I/O line pair, the local I/O line pair including a first local I/O line and a second local I/O line; and
a local I/O line control unit including a first capacitor and a second capacitor, the first capacitor increasing a voltage level of the first local I/O line based on the local sensing enable signal, the second capacitor increasing a voltage level of the second local I/O line based on the local sensing enable signal, wherein the first capacitor is a first MOS transistor that includes a gate electrode receiving the local sensing enable signal, a first electrode connected to the first local I/O line, and a second electrode connected to the first electrode of the first MOS transistor, and wherein the second capacitor is a second MOS transistor that includes a gate electrode receiving the local sensing enable signal, a first electrode connected to the second local I/O line, and a second electrode connected to the first electrode of the second MOS transistor.

3. The local sense amplifier circuit as claimed in claim 1, wherein the local I/O line control unit increases the voltage levels of the local I/O line pair when the local sensing enable signal is activated, and wherein the local data sensing unit amplifies the voltage difference between the local I/O line pair to provide the amplified voltage difference to the global I/O line pair when the local sensing enable signal is activated.

4. The local sense amplifier circuit as claimed in claim 1, wherein the local data sensing unit includes:
a sensing block connected to the local I/O line pair, and configured to sense the voltage difference between the local I/O line pair;
an output block configured to amplify the sensed voltage difference in response to the local sensing enable signal to provide the amplified voltage difference to the global I/O line pair; and
a sensing control block configured to control the sensing operation of the sensing block and the amplifying operation of the output block in response to a selection enable signal.

5. The local sense amplifier circuit as claimed in claim 4, wherein the sensing control block includes: a first MOS transistor having a first electrode receiving a ground voltage, a gate electrode receiving the selection enable signal, and a second electrode connected to a control node.

6. The local sense amplifier circuit as claimed in claim 5, wherein the sensing block includes:
a second MOS transistor having a first electrode connected to the control node, a gate electrode connected to the first local I/O line, and a second electrode; and
a third MOS transistor having a first electrode connected to the control node, a gate electrode connected to the second local I/O line, and a second electrode.

7. The local sense amplifier circuit as claimed in claim 6, wherein the output block includes:
a fourth MOS transistor having a first electrode connected to the second electrode of the second MOS transistor, a gate electrode receiving the local sensing enable signal, and a second electrode connected to one of the global I/O line pair; and
a fifth MOS transistor having a first electrode connected to the second electrode of the third MOS transistor, a gate electrode receiving the local sensing enable signal, and a second electrode connected to another one of the global I/O line pair.

8. A semiconductor memory device, comprising:
a memory cell array connected to a bitline pair;
a bitline sense amplifier circuit configured to amplify a voltage difference between the bitline pair based on a bitline sensing enable signal;
a column selection circuit configured to provide the amplified voltage difference between the bitline pair to a local input/output (I/O) line pair in response to a column selection signal, the local I/O line pair including a first local I/O line and a second local I/O line;
a local sense amplifier circuit including a first capacitor and a second capacitor, and configured to amplify a voltage difference between the local I/O line pair based on a local sensing enable signal to provide the amplified voltage difference between the local I/O line pair to a global I/O line pair, the first capacitor increasing a voltage level of the first local I/O line based on the local sensing enable signal, the second capacitor increasing a voltage level of the second local I/O line based on the local sensing enable signal; and an I/O sense amplifier circuit configured to amplify a voltage difference between the global I/O line pair to generate a sensing output signal.

9. The semiconductor memory device as claimed in claim 8, wherein the local sense amplifier circuit increases the voltage levels of the local I/O line pair when the semiconductor memory device reads out the data stored in the memory cell array.

10. The semiconductor memory device as claimed in claim 8, further comprising: a local I/O line precharge control circuit configured to precharge the local I/O line pair based on a precharge control signal and a precharge voltage.

11. The semiconductor memory device as claimed in claim 10, wherein the local I/O line precharge control circuit includes:
  a first metal oxide semiconductor (MOS) transistor having a first electrode connected to the first local I/O line, a gate electrode receiving the precharge control signal, and a second electrode connected to the second local I/O line;
  a second MOS transistor having a first electrode connected to the first local I/O line, a gate electrode receiving the precharge control signal, and a second electrode receiving the precharge voltage; and
  a third MOS transistor having a first electrode connected to the second electrode of the second MOS transistor, a gate electrode receiving the precharge control signal, and a second electrode connected to the second local I/O line.

12. The semiconductor memory device as claimed in claim 8, further comprising: an I/O buffer configured to generate output data based on the sensing output signal.

13. The semiconductor memory device as claimed in claim 8, wherein the I/O sense amplifier circuit amplifies the voltage difference between the global I/O line pair with current mode or voltage mode.

14. An electronic device, comprising:
  a processor;
  a memory cell array coupled to the processor, the memory cell array including at least one memory cell connected to a bitline pair;
  a bitline sense amplifier circuit configured to receive voltages of the bitline pair and provide amplified voltages to a local input/output (I/O) line pair, the local I/O line pair including a first local I/O line and a second local I/O line;
  a local sense amplifier circuit including a first capacitor and a second capacitor, the local sense amplifier circuit being configured to amplify a voltage difference between the local I/O line pair based on a local sensing enable signal to provide the amplified voltage difference between the local I/O line pair to a global I/O line pair, the first capacitor increasing a voltage level of the first local I/O line based on the local sensing enable signal, the second capacitor increasing a voltage level of the second local I/O line based on the local sensing enable signal; and
  an I/O sense amplifier circuit configured to amplify a voltage difference between the global I/O line pair to generate a sensing output signal.

15. The electronic device as claimed in claim 14, wherein:
  the first capacitor is a first metal oxide semiconductor (MOS) transistor that includes a gate electrode connected to the first local I/O line, and includes a first electrode and a second electrode coupled together and receiving the local sensing enable signal, and
  the second capacitor is a second MOS transistor that includes a gate electrode connected to the second local I/O line, the second I/O line having a complementary signal to that of the first I/O line, the second capacitor further including a first electrode and a second electrode coupled together, coupled to the first and second electrodes of the first MOS transistor, and receiving the local sensing enable signal.

16. The electronic device as claimed in claim 15, wherein the first and second MOS transistors are NMOS transistors, and the local sensing enable signal provides a positive voltage pulse, relative to an inactive state of the local sensing enable signal, to the first and second electrodes of the first and second NMOS transistors.

* * * * *